United States Patent
Blaettler et al.

(10) Patent No.: US 10,042,699 B2
(45) Date of Patent: Aug. 7, 2018

(54) MULTI-CHIP DEVICE AND METHOD FOR STORING DATA

(71) Applicant: INTERNATIONAL BUSINESS MACHINES CORPORATION, Armonk, NY (US)

(72) Inventors: Tobias Blaettler, Maur (CH); Thomas Mittelholzer, Zurich (CH); Nikolaos Papandreou, Thalwil (CH); Thomas Parnell, Zürich (CH); Charalampos Pozidis, Thalwil (CH); Milos Stanisavljevic, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/922,356

(22) Filed: Oct. 26, 2015

(65) Prior Publication Data
US 2016/0124807 A1    May 5, 2016

(30) Foreign Application Priority Data
Oct. 29, 2014   (CH) .................... 1419240.5

(51) Int. Cl.
*G11C 29/00*    (2006.01)
*G06F 11/10*    (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/0619; G06F 3/064; G06F 3/0688; G11C 29/52;
(Continued)

(56) References Cited

U.S. PATENT DOCUMENTS 8,533,558 B2   9/2013   Yurzola et al.
8,635,509 B2   1/2014   Choi et al.
(Continued)

OTHER PUBLICATIONS

Motwani, R. et al., Design of LDPC coding schemes for exploitation of bit error rate diversity across dies in NAND flash memory, 2013 International Conference on Computing, Networking and Communications, Data Storage Technology and Applications Symposium, Jan. 28, 2013, pp. 950-954, IEEE, San Diego, CA, USA. <http://ieeexplore.ieee.org/stamp/stamp.jsp?tp=&arnumber=6504218/>.
(Continued)

*Primary Examiner* — Guerrier Merant
(74) *Attorney, Agent, or Firm* — Rabin Bhattacharya

(57) ABSTRACT

A multi-chip device and method for storing input data. The multi-chip device includes: a plurality of memory chips being adapted to store encoded input data, wherein each of the plurality of memory chips includes a detection unit that outputs detection information; an evaluation unit being adapted to perform an evaluation of the detection information from each of the plurality of memory chips, and to adapt the detection algorithm of any of the detection units depending on the performed evaluation; a combination unit being adapted to receive the detected bits and to combine the detected bits; and a decoding unit being adapted to output decoded data by decoding the combined detected bits. The present invention also provides a method and a computer program product for storing input data.

19 Claims, 7 Drawing Sheets

(51) Int. Cl.
*G11C 29/52* (2006.01)
*G06F 3/06* (2006.01)
*G11C 29/02* (2006.01)
*G11C 29/04* (2006.01)

(52) U.S. Cl.
CPC ........ *G06F 3/0688* (2013.01); *G06F 11/1012* (2013.01); *G11C 29/021* (2013.01); *G11C 29/028* (2013.01); *G11C 29/52* (2013.01); *G11C 2029/0409* (2013.01); *G11C 2029/0411* (2013.01)

(58) Field of Classification Search
CPC ................ G11C 29/021; G11C 29/028; G11C 2029/0411; G11C 2029/0409
See application file for complete search history.

(56) References Cited

U.S. PATENT DOCUMENTS

| | | | |
|---|---|---|---|
| 8,656,255 | B1 | 2/2014 | Nemazie et al. |
| 8,719,663 | B2 | 5/2014 | Li et al. |
| 2011/0032758 | A1 | 2/2011 | Son et al. |
| 2011/0307758 | A1 | 12/2011 | Fillingim |
| 2012/0317460 | A1 | 12/2012 | Chilappagari et al. |
| 2013/0024735 | A1 | 1/2013 | Chung et al. |
| 2013/0139035 | A1 | 5/2013 | Zhong et al. |
| 2014/0040704 | A1 | 2/2014 | Wu et al. |
| 2014/0108891 | A1 | 4/2014 | Strasser et al. |
| 2014/0181618 | A1 | 6/2014 | Wu et al. |
| 2014/0369176 | A1* | 12/2014 | Rudershausen ...... H04B 1/7075 370/209 |
| 2016/0203046 | A1* | 7/2016 | Hanafusa ............ G06F 11/1068 714/764 |

OTHER PUBLICATIONS

Yang, C. et al., Improving reliability of non-volatile memory technologies through circuit level techniques and error control coding, EURASIP Journal on Advances in Signal Processing 2012, Oct. 3, 2012. <http://www.asp.eurasipjournals.com/content/pdf/1687-6180-2012-211.pdf/>.

* cited by examiner

MULTI-CHIP DEVICE AND METHOD FOR STORING DATA

CROSS-REFERENCE TO RELATED APPLICATION

This application claims priority under 35 U.S.C. § 119 from UK Patent Application No. 1419240.5 filed Oct. 29, 2014, the entire contents of which are incorporated herein by reference.

FIELD OF THE INVENTION

The invention relates to a multi-chip device and to a method for storing data in the memory chips of the multi-chip device.

BACKGROUND OF THE INVENTION

In memory systems including multiple non-volatile memory chips, error detection and correction is a commonly known issue. In particular, emerging non-volatile memory (NVM) devices, known as storage class memories, are intended to replace or complement conventional technologies, i.e. DRAM and variants, in building future memory systems. The typical architecture of contemporary memory systems consists of multiple memory chips which are put together in a memory module (DIMM). Such architectures ensure high capacity, high bandwidth, as well as very high reliability. The latter is achieved because of the very high reliability of individual DRAM chips, and the possibility to spread information across multiple chips, and therefore be able to tolerate random or burst errors with relatively simple error correction codes.

One possible memory system is volatile storage based on DRAM chips, which are extremely reliable devices, guaranteed to provide ultra-low raw bit error rates (BER) by refreshing their contents at short intervals. On the other hand, non-volatile storage based on NVM devices are rather un-reliable because of high raw BER, but they do not require refresh to retain data. The objective in future memory systems is to use NVM to replace or complement DRAM in order to leverage the superior capacity and cost/GB of these NVM technologies. However, the higher raw BER of such NVMs presents a very challenging problem which has to be overcome in order to build highly reliable memory systems.

One solution is to employ very strong error correction codes (ECC) to protect against the increased random and burst errors of NVMs. Error detection and corrections systems are for example disclosed in US 2014/0181618 A1 or U.S. Pat. No. 8,533,558 B2.

In DIMM architectures the user data is spread across a pre-defined number of chips, and an ECC parity is stored in additional chips, which are reserved for that purpose. However, when using stronger ECC, more extra chips can be needed to store the parity. This results in several critical technical issues. In particular, the bus width in today's DIMMs is fixed and can not be easily extended and more signals from more chips require additional buffer ASICs on the DIMM, which can result in signal integrity problems. Also, important business issues can arise since the memory-module industry and system manufacturers are unwilling to adopt non-standard solutions.

Accordingly, the present invention provides a multi-chip device and a method for storing data and improving the bit error rates during the detection and/or decoding of the stored data.

SUMMARY OF THE INVENTION

According to a first aspect of the present invention, a multi-chip device for storing input data is provided. The multi-chip device includes: a plurality of memory chips being adapted to store encoded data, wherein each of the plurality of memory chips includes a detection unit being adapted to perform a detection algorithm on the stored encoded data for retrieving detected bits and to output the retrieved detected bits and detection information associated with the detection algorithm; an evaluation unit being adapted to perform an evaluation of the detection information from each of the plurality of memory chips and to adapt the detection algorithm of any of the detection units depending on the performed evaluation; a combination unit being adapted to receive the detected bits and to combine the detected bits; and a decoding unit being adapted to output decoded data by decoding the combined detected bits.

The multi-chip memory device according to embodiments of the first aspect of the present invention aims to improve the BER at the output of the ECC engine, also known as the uncorrectable BER, without increasing the ECC strength. The multi-chip memory device according to embodiments of the present invention is to detects and corrects potential uncorrectable errors before they reach the ECC engine by adding the evaluation unit upstream of the combination unit and the decoding unit.

According to a second aspect of the present invention, a method for storing encoded input data in a multi-chip device is provided. The method includes the steps of: storing encoded input data in a plurality of memory chips; performing a detection algorithm on the stored encoded input data for retrieving detected bits; outputting the retrieved detected bits and detection information associated with the detection algorithm; performing an evaluation of the detection information from each of the plurality of memory chips; adapting the detection algorithm of any of the detection units depending on the performed evaluation; receiving the detected bits; combining the detected bits; and outputting decoded data by decoding the combined detected bits.

According to a third aspect of the present invention, a computer program product is provided. The non-transitory computer program product is for storing input data in a multi-chip device including a computer readable storage medium having program instructions embodied therewith, the program instructions executable by a computer device to cause the computer device to performing operations including the steps of: storing encoded input data in a plurality of memory chips; performing a detection algorithm on the stored encoded input data for retrieving detected bits; outputting the retrieved detected bits and detection information associated with the detection algorithm; performing an evaluation of the detection information from each of the plurality of memory chips; adapting the detection algorithm of any of the detection units depending on the performed evaluation; receiving the detected bits; combining the detected bits; and outputting decoded data by decoding the combined detected bits.

BRIEF DESCRIPTION OF THE DRAWINGS

Through the more detailed description of some embodiments of the present invention in the accompanying drawings, the above and other objects, features and advantages of the present invention will become more apparent, wherein the same reference generally refers to the same components in the embodiments of the present invention.

DETAILED DESCRIPTION OF THE PREFERRED EMBODIMENTS

Some preferable embodiments will be described in more detail with reference to the accompanying drawings, in which the preferable embodiments of the present invention have been illustrated. However, the present invention can be implemented in various manners, and thus should not be construed to be limited to the embodiments disclosed herein. On the contrary, those embodiments are provided for the thorough and complete understanding of the present invention, and to completely convey the scope of the present invention to those skilled in the art.

Figure 1:
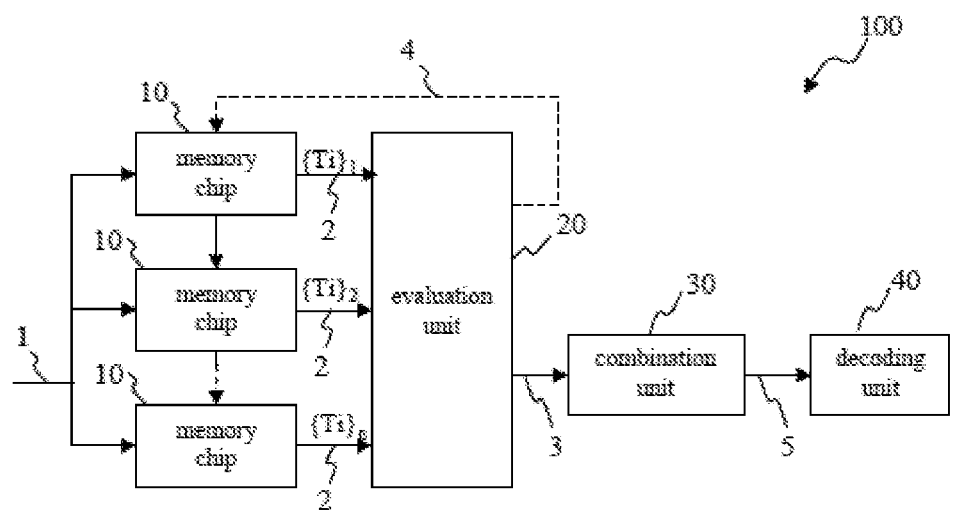
FIG. 1 shows an embodiment of a multi-chip device for storing data.

Referring to FIG. 1, an embodiment of multi-chip device 100 for storing data is shown. Multi-chip device 100 includes a plurality of memory chips 10. In each of memory chips 10, data 1 can be stored. Input data 1 can be received from an encoding and spreading unit (not shown). Each of the plurality of memory chips 10 includes a detection unit being adapted to execute a detection algorithm, like DID, on the stored data for retrieving detected bits. Subsequently, memory chips 10 output retrieved detected bits and detection information 2 associated with the detection algorithm.

Evaluation unit 20 receives the detected bits as well as detection information 2. Evaluation unit 20 performs an evaluation of detection information 2 from each of the plurality of memory chips 10. This means that evaluation unit 20 decides whether the detection of the bits can potentially contain errors or not. Based on this evaluation, evaluation unit 20 can adapt the detection algorithm of any of the detection units using, for example, new detection parameters 4. If evaluation unit 20 has not detected that there was an error, the detection algorithm of the corresponding detection unit will not be adapted.

Combination unit 30 then receives detected bits 3, for example, from evaluation unit 20, and combines the detected bits to generate combined detected bits 5. Decoding unit 40 outputs decoded data after decoding the combined detected bits. Decoding unit 40 can perform error correction decoding on the combined detected bits.

Figure 2:
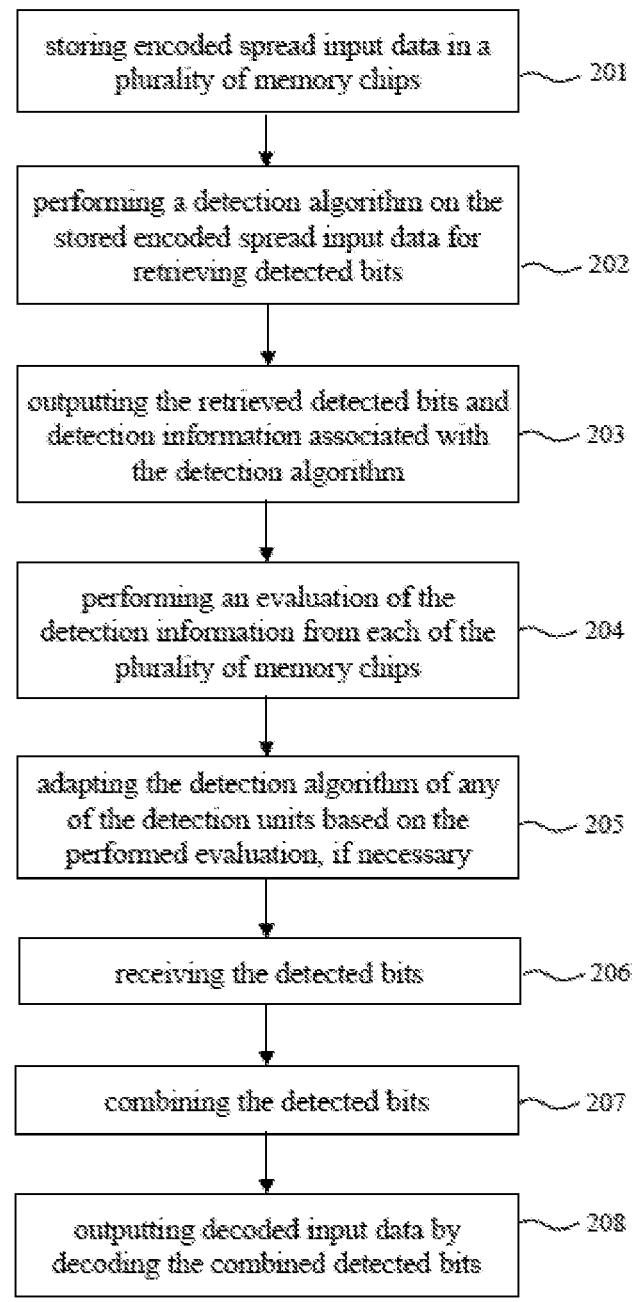
FIG. 2 shows an embodiment of a sequence of method steps for storing data in a multi-chip device.

Referring to FIG. 2, an embodiment of a sequence of method steps for storing data in multi-chip device 100 is shown. In step 201, encoded spread input data 1 are stored in a plurality of memory chips 10. In step 202, a detection algorithm is performed on stored encoded spread input data 1 for retrieving detected bits. In step 203, retrieved detected bits and detection information 2 associated with the detection algorithm are output to evaluation unit 20. In step 204, an evaluation of the detection information from each of the plurality of memory chips 10 is performed. In step 205, the detection algorithm of some of the detection units based on the performed evaluation is adapted depending on the outcome of evaluation step 204. In step 206, detected bits 3 are received by combination unit 30. In step 207, detected bits 3 are combined. In step 208, decoded data are output by decoding combined detected bits 5.

Figure 3:
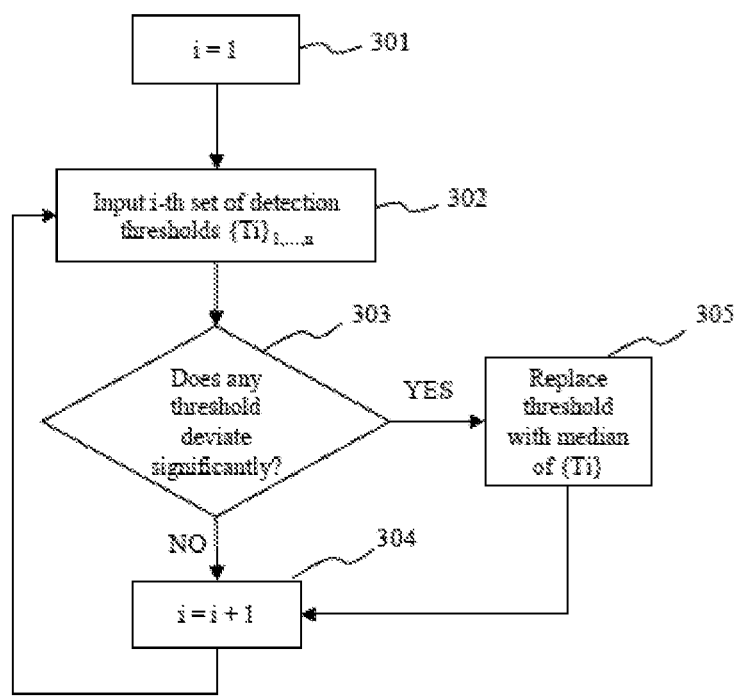
FIG. 3 shows an embodiment of a sequence of method steps for evaluating the detection thresholds of one memory chip.

FIG. 3 shows an embodiment of a sequence of method steps for evaluating the detection information of the plurality of memory chips 10. The evaluation is performed for a set of detection thresholds of the plurality of memory chips. Each set of thresholds, $\{Ti\}1, \ldots, n, (i=1, 2, 3)$, is examined separately, where n is the number of chips 10 in multi-chip device 100. This means that in step 301, i is determined and, in step 302, the i-th set of detection thresholds is input to evaluation unit 20. In step 303, it is determined whether any threshold deviates significantly from the other thresholds of the same set. Whenever a threshold is found that deviates significantly from the rest, it is replaced by the median value of the set in step 305. Other detection/replacement protocols are also possible. For example, instead of the median, the average value of the set or the mode can be used. In step 304, i is incremented and the evaluation starts for the next set of detection thresholds.

Figure 4:
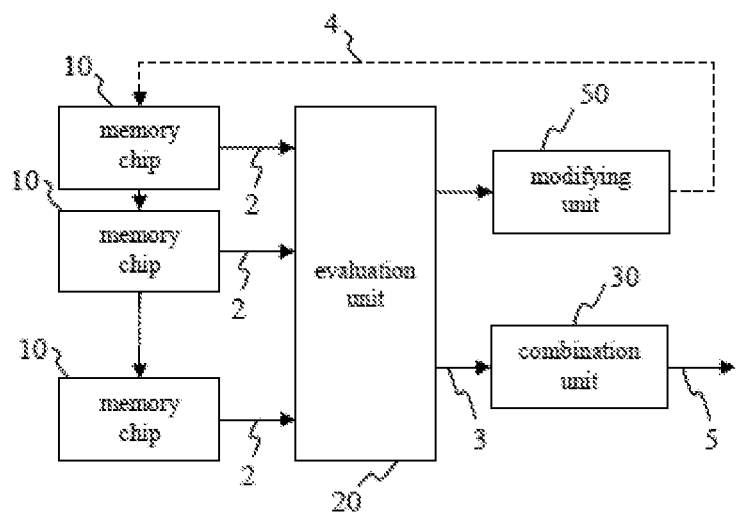
FIG. 4 shows a further embodiment of a multi-chip device for storing data.

FIG. 4 shows a further embodiment of multi-chip device 100 for storing data. In addition to the embodiment of FIG. 1, modifying unit 50 is provided which can be optionally executed, conditional on the evaluation performed by evaluation unit 20. Modifying unit 50 is responsible for modifying detection parameters used by the detection algorithms. The detection parameters can be the detection thresholds. Modifying unit 50 can be configured so that the modification of the detection parameters is executed only once. Alternatively, modifying unit 50 can be configured such that modification of the detection parameters is executed multiple times, until some condition is satisfied, or a maximum number of times is reached. Further, the modification of the detection parameters can apply to selected memory chips 10 only. This can be, for example, memory chips 10 including a detection threshold that deviates significantly.

Figure 5:
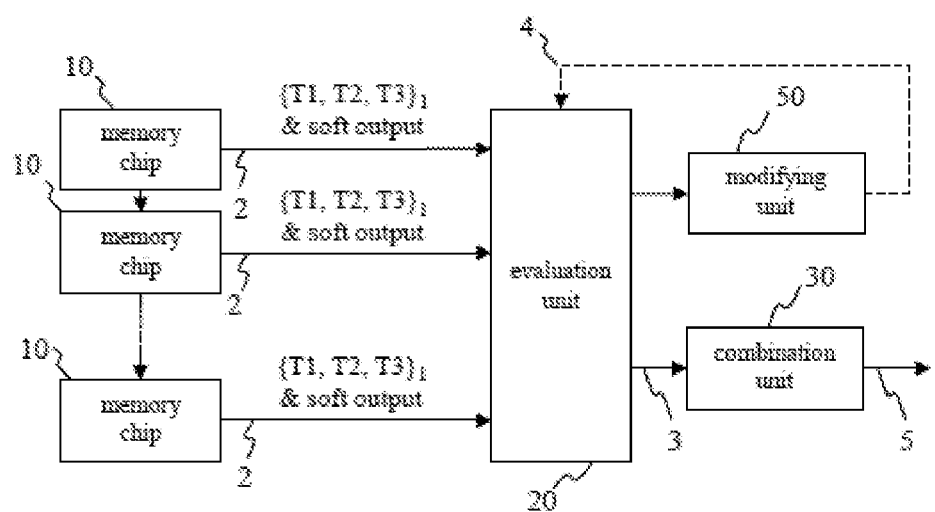
FIG. 5 shows a further embodiment of a multi-chip device for storing data.

FIG. 5 shows a further embodiment of multi-chip device 100 for storing data. According to this embodiment, evaluation unit 20 can also perform a detection function upon a trigger from modifying unit 50. To enable that function, each memory chip 10 sends soft-output information to evaluation unit 20, in addition to detection thresholds 2.

Figure 6:
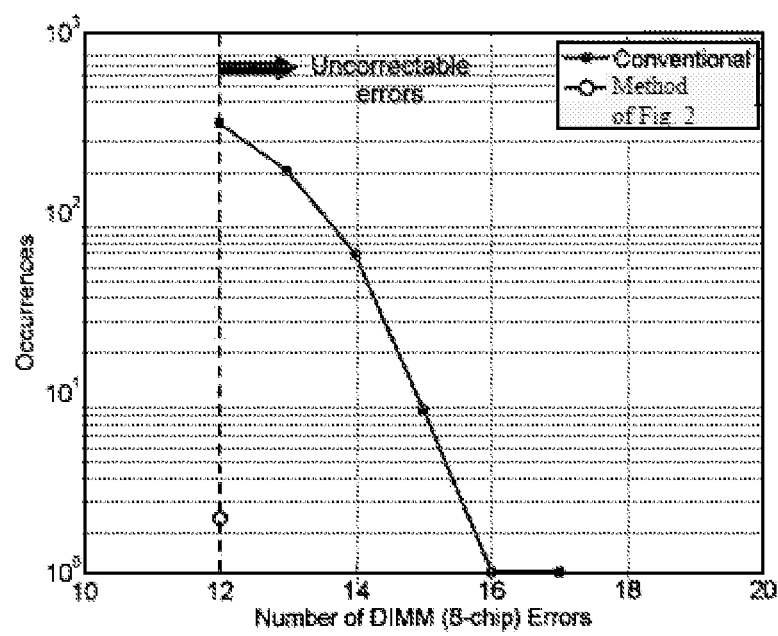
FIG. 6 shows a diagram illustrating the performance using a sequence of method steps for storing data in a multi-chip device.

FIG. 6 shows a diagram illustrating the performance using a sequence of method steps for storing data in a multi-chip device. A number of detection errors at the output of an 8-chip block are shown. The number of uncorrectable errors is drastically reduced compared to a conventional method. Here an error correction code is assumed that is able to correct up to 11 errors in an 8-chip block. Therefore, an uncorrectable error event is an event in which 12 or more errors occur in an 8-chip block.

Figure 7:
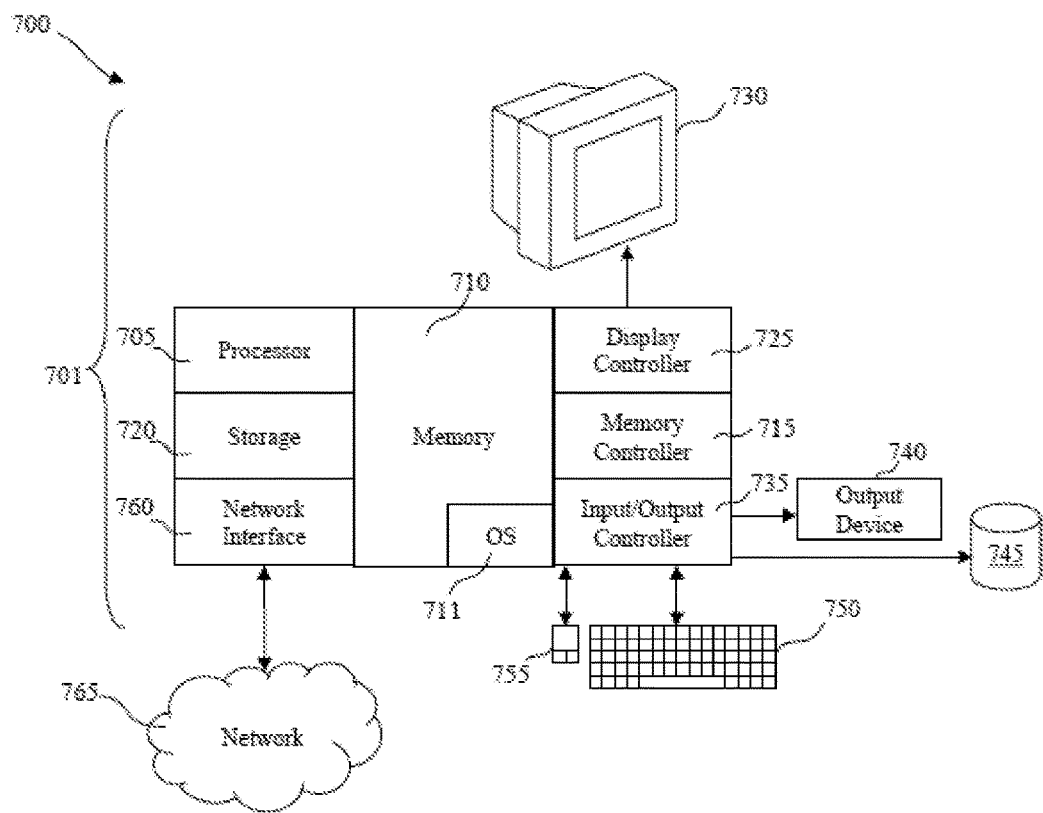
FIG. 7 shows a schematic block diagram of an embodiment of a system adapted for performing the method for storing data.

FIG. 7 shows a schematic block diagram of an embodiment of a system adapted for performing the method for storing data.

Computerized devices can be suitably designed for implementing embodiments of the present invention as described herein. In that respect, it can be appreciated that the method described herein is largely non-interactive and automated. In exemplary embodiments, the method described herein can be implemented either in an interactive, partly-interactive or non-interactive system. The method described herein can be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of above methods of FIGS. 2 and 3 can be implemented in software, as an executable program, the latter executed by suitable digital processing devices. More generally, embodiments of the present invention can be implemented wherein general-purpose digital computers, such as personal computers, workstations, etc., are used.

For instance, system 700 depicted in FIG. 7 schematically represents computerized unit 701. In terms of hardware architecture, as shown in FIG. 7, computerized unit 701 includes processor 705, memory 710 coupled to memory controller 715, and one or more input and/or output (I/O) devices 740, 745, 750, 755 (or peripherals) that are communicatively coupled via local input/output controller 735. Further, input/output controller 735 can be one or more buses or other wired or wireless connections. Input/output controller 735 can have additional elements such as controllers, buffers (caches), drivers, repeaters, and receivers, to enable communications. Further, the local interface can include address, control, and/or data connections to enable appropriate communications among the aforementioned components.

Processor 705 is a hardware device for executing software, particularly that stored in memory 710. Processor 705 can be any custom made or commercially available processor, a central processing unit (CPU), an auxiliary processor among several processors associated with computerized unit 701, a semiconductor based microprocessor (in the form of a microchip or chip set), or generally any device for executing software instructions.

Memory 710 can include any one or combination of volatile memory elements and nonvolatile memory elements. Moreover, memory 710 can incorporate electronic, magnetic, optical, and/or other types of storage media. Note that memory 710 can have a distributed architecture, where various components are situated remote from one another, but can be accessed by processor 705.

The software in memory 710 can include one or more separate programs, each of which includes an ordered listing of executable instructions for implementing logical functions. In the example of FIG. 7, the software in memory 710 includes method described herein in accordance with exemplary embodiments and a suitable operating system (OS) 711. OS 711 essentially controls the execution of other computer programs, such as the methods as described herein, and provides scheduling, input-output control, file and data management, memory management, and communication control and related services.

The methods described herein can be in the form of a source program, executable program (object code), script, or any other entity including a set of instructions to be performed. When in a source program form, then the program needs to be translated via a compiler, assembler, interpreter, or the like, as known per se, which can or can not be included within memory 710, so as to operate properly in connection with OS 711. Furthermore, the method can be written as an object oriented programming language, which has classes of data and methods, or a procedure programming language, which has routines, subroutines, and/or functions.

Conventional keyboard 750 and mouse 755 can be coupled to input/output controller 735. Other I/O devices 740-755 can include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent controllers 735 for further processing. Sensor nodes are ideally small, consume low energy, are autonomous and operate unattended.

In addition, I/O devices 740-755 can further include devices that communicate both inputs and outputs. System 700 can further include display controller 725 coupled to display 730. In exemplary embodiments, system 700 can further include network interface or transceiver 760 for coupling to network 765.

Network 765 transmits and receives data between unit 701 and external systems. Network 765 is possibly implemented in a wireless fashion using wireless protocols and technologies such as WiFi, WiMax, etc. Network 765 can be a fixed wireless network, a wireless local area network (LAN), a wireless wide area network (WAN) a personal area network (PAN), a virtual private network (VPN), intranet or other suitable network system and includes equipment for receiving and transmitting signals.

Network 765 can also be an IP-based network for communication between computerized unit 701 and any external server, client and the like via a broadband connection. In exemplary embodiments, network 765 can be a managed IP network administered by a service provider. Besides, network 765 can be a packet-switched network such as a LAN, WAN, Internet network, etc.

Computerized unit 701 is a PC, workstation, intelligent device or the like, the software in memory 710 can further include a basic input output system (BIOS). The BIOS is stored in ROM so that the BIOS can be executed when computerized unit 701 is activated.

When computerized unit 701 is in operation, processor 705 is configured to execute software stored within memory 710, to communicate data to and from memory 710, and to generally control operations of computer 701 pursuant to the software. The methods described herein and OS 711, in whole or in part are read by processor 705, typically buffered within processor 705, and then executed. When the methods described herein are implemented in software, the method can be stored on any computer readable medium, such as storage 720, for use by or in connection with any computer related system or method.

The present invention can be a system, a method, and/or a computer program product. The computer program product can include a computer readable storage medium having computer readable program instructions thereon for causing a processor to carry out aspects of the present invention.

The computer readable storage medium can be a tangible device that can retain and store instructions for use by an instruction execution device. The computer readable storage medium can be an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

More generally, while the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiments disclosed, but that the present invention will include all embodiments falling within the scope of the appended claims.

Multi-level cell phase change memories (MLC PCM) are considered as a leading non-volatile memory (NVM) candidate to replace or complement DRAM in main memory enterprise-class applications. Such applications use memory in a multi-chip form factor, in order to increase bandwidth, storage capacity, and reliability. Thus, input data are encoded using error correction codes (ECC) and spread over a plurality of memory chips of a memory device. In MLC PCM chips, a detection algorithm guarantees low bit error rates (BER) even at adverse noise/drift conditions. To support small cache line sizes (64 Bytes) used in main memory applications, the detection algorithm can operate on very small data blocks of 64 bits.

Thus, in conventional memory architectures, an input data block is ECC-encoded, and then spread among multiple chips for data storage. During data retrieval, the corresponding data are read from each chip. Each chip performs its own data detection and submits detected bits at its output. Those bits are re-combined from all chips and finally ECC-decoded to reconstruct the user data block, i.e. the input data.

However, although very rarely, the 64-bit detection algorithm can produce a large number of detection errors, a so called "burst". Combined with random errors from multiple other chips, such "burst" errors can exceed the correction capability of the underlying ECC, leading to an uncorrectable error.

In such a rare case, a large number of errors can appear at the output of a single chip detection engine, as error bursts in more than one chip are extremely rare. The ECC can be designed to tolerate a complete chip failure (a burst sweeping an entire chip). However, a combination of errors in other chips can cause the ECC to fail. Upon ECC failure, two possibilities exist for an Error Recovery Mode: If it is possible to detect which chip engine failed, erasure decoding can take place. Alternatively, a second detection round can be triggered, this time with different detection parameters.

In multi-chip configurations, redundancy and soft information can be used to detect and correct such potentially catastrophic events (i.e., those leading to uncorrectable errors), before reaching the ECC engine, i.e. the decoding unit or decoder. In addition, non-catastrophic, random errors can be corrected by the multi-chip memory device due to the evaluation unit. As a result, the Uncorrectable Error Rate at the ECC output can be reduced.

Before the combination unit and the decoding unit start to work, the evaluation unit performs an evaluation of the detection information in order to decide if there can be a catastrophic error or not. The error results from the detection algorithm of each of the memory chips. Thus, the detection within the memory chips can be adjusted to avoid a detection error, before the further processing by the combination unit and the decoding unit starts.

The respective units, e.g. the evaluation unit, can be implemented in hardware and/or in software. If said unit is implemented in hardware, it can be embodied as a device, e.g. as a computer or as a processor or as a part of a system, e.g. a computer system. If said unit is implemented in software it can be embodied as a computer program product, as a function, as a routine, as a program code or as an executable object.

According to an embodiment, the detection algorithm of each of the detection units is a threshold-based detection algorithm, for instance a drift invariant detection (DID) algorithm.

Each of the memory chips has its own detection unit performing its own drift invariant detection algorithm. This means that during data retrieval, the corresponding data are read from each chip. Each chip performs its own data detection and submits detected bits at its output using the corresponding detection algorithm. The detection algorithm can be the same for each memory chip, but the parameters used in the algorithm can vary.

According to a further embodiment, the multi-chip device further includes a modifying unit being adapted to modify detection parameters of the detection algorithm of any of the detection units based on the performed evaluation.

The modifying unit can receive information from the evaluation unit on which detection parameters should be modified. The detection parameters can correspond to the detection information on which the evaluation is based.

According to a further embodiment, the modifying unit is adapted to modify the detection parameters of a subset of the detection units, wherein the subset is selected based on the evaluation.

The evaluation unit decides which detection algorithm, i.e. the detection algorithm of which detection unit, needs to be adapted. The modifying unit then provides appropriately adapted detection parameters to the corresponding memory chip and its detection unit.

According to a further embodiment, the detection information includes a set of detection thresholds and/or soft information.

The detection information can be provided together with the detected bits. The soft (-output) information can be transmitted through the data bus of the memory chip, for example by executing a burst read command.

In memory chips information is stored by modifying some parameter of a semiconductor device, and readout by sensing this modified parameter. In SLC storage this parameter can take any of two possible nominal values, a low value and a high value. Readout is performed by comparing the sensed parameter value with a threshold, and deciding 0/1 (or 1/0) if the value is below/above the threshold. In 2 bits/cell MLC storage, the parameter can assume one of four possible nominal levels. Readout then is performed by comparing the sensed parameter with three thresholds (say T1,T2,T3), and deciding 0, 1, 2 or 3 (or some other value) depending on the parameter value being lower than T1, higher than T1 but lower than T2, higher than T2 but lower than T3, and higher than T3. In the above description, the detection unit is said to produce hard output. If the detection unit outputs more information than 1 bit in SLC or 2 bits in MLC mode, then it is said to produce soft information, or information of higher accuracy.

According to a further embodiment, the evaluation unit is adapted to provide a comparison result by comparing the detection thresholds and to adapt the detection algorithm based on the comparison result.

As the detection thresholds can be transmitted to the evaluation unit together with the detected bits, a comparison of these values provides a simple way of evaluation. Further, significant deviations between the threshold values are an indication of an error during data detection within the memory chip.

According to a further embodiment, the detection information of each of the memory chips includes a set of detection thresholds, and the evaluation unit is adapted to compare the corresponding detection thresholds of the sets of detection thresholds of the plurality of memory chips For example, three detection thresholds {T1, T2, T3} can be transferred through the data bus of each chip. Each threshold T1 can have 6-bits accuracy, so a total of 18 bits would be transferred. This can be achieved by issuing a burst of three transfers at each chip output, if it is assumed that the data bus is 8-bits wide (3×8=24>18).

According to a further embodiment, if a detection threshold of the set of detection thresholds of any of the memory chips deviates by more than a predetermined amount from the remaining corresponding detection thresholds of the sets of detection thresholds of the plurality of memory chips, the evaluation unit is configured to adapt the detection algorithms of the respective memory chips by adjusting the deviating detection threshold.

If the thresholds of one memory chip deviate significantly, an error can be assumed to have occurred. Thus, the data retrieval of this memory chip should be repeated. In order to reduce the error probability, the threshold which deviates significantly is adjusted for the next round of data detection.

According to a further embodiment, the evaluation unit is adapted to adjust the deviating detection threshold by replacing the deviating detection thresholds by a replacement value.

It can be predefined which value should be chosen to replace a deviating detection threshold value. The replacement value can be a fixed value or it can be predefined how to choose the value.

According to a further embodiment, the replacement value is a mean value or median value or mode of the remaining corresponding detection thresholds of the plurality of memory chips.

Using a mean value or median value, the deviating value is biased towards the other detection threshold values of the other memory chips. Also other replacement values can be chosen. The deviating detection value can be included or excluded when determining the mean value or median value.

According to a further embodiment, if the detection algorithm of one of the detection units is adapted by the evaluation unit, the respective detection unit is adapted to perform the adapted detection algorithm on the stored encoded input data for retrieving detected bits and to output the detected bits and detection information associated with the adapted detection algorithm.

When the detection unit of a memory chip receives the adapted detection algorithm, e.g. the adapted detection parameters, the detection unit re-detects the bits from the stored data. As the detection algorithm is adapted, the error during detection should be reduced or eliminated.

According to a further embodiment, if the detection algorithm of one of the detection units is adapted by the evaluation unit, i.e. if the evaluation unit decides to adapt the detection algorithm of one of the chips, the evaluation unit itself is adapted to perform the detection algorithm for the respective memory chip.

According to this embodiment, further evaluation is only carried out for data which need to be re-detected. Further, this is done directly in the evaluation unit which received the necessary information (i.e. soft output information) from the memory chips at the beginning. This can reduce the computational costs.

According to a further embodiment, the evaluation unit is adapted to re-produce the detected bits and detection information of any of the memory chips by performing the detection algorithm on data received from each of the memory chips.

The re-produced threshold values can be evaluated again. Thus, it can be decided if further adaptation of the detection algorithm, i.e. the detection parameters, is necessary.

What is claimed is:

1. A system for reducing uncorrectable errors in non-volatile memory chips, comprising:
    a plurality of memory chips for storing encoded input data;
    a plurality of detection units for outputting detection information, each detection unit in the plurality of detection units corresponding to a memory chip in the plurality of memory chips, wherein the detection information includes a set of detection thresholds and soft information;
    an evaluation unit configured to adapt a detection algorithm for a detection unit in the plurality of detection units, the configuration occurring in response to the detection information for the detection unit being above a pre-determined threshold;
    a combination unit for combining sets of detected bits received from memory chips in the plurality of memory chips; and
    a decoding unit configured to receive the combined sets of detected bits and decode the combined sets of detected bits to output decoded data.

2. The system of claim 1, wherein the detection unit performs a detection algorithm on the stored encoded input data for retrieving detected bits and to output the retrieved detected bits and detection information associated with the detection algorithm.

3. The system of claim 1, wherein the detection algorithm of each of the detection units is a threshold-based detection algorithm.

4. The system of claim 1, further comprising a modifying unit for modifying detection parameters of the detection algorithm of any of the detection units based on the performed evaluation.

5. The system of claim 4, wherein the modifying unit is adapted to modify the detection parameters of the detection algorithm of a subset of the detection units, wherein the subset is selected based on the performed evaluation.

6. The multi-chip device of claim 1, wherein the evaluation unit is adapted to provide a comparison result by comparing the detection thresholds and to adapt the detection algorithm based on the comparison result.

7. The system of claim 1, wherein the detection information of each of the memory chips includes a set of detection thresholds, and the evaluation unit is adapted to compare the corresponding detection thresholds of the sets of detection thresholds of the plurality of memory chips.

8. The system of claim 7, wherein the evaluation unit is configured to adapt the detection algorithms of the respective memory chips by adjusting the deviating detection thresholds in response to a detection threshold of the set of detection thresholds of any of the memory chips deviating by more than a predetermined amount from the remaining corresponding detection thresholds of the plurality of memory chips.

9. The system of claim 8, wherein the evaluation unit is adapted to adjust the deviating detection thresholds by replacing the deviating detection thresholds by a replacement value.

10. The system of claim 9, wherein the replacement value is a mean value or median value or mode of the remaining corresponding detection thresholds of the plurality of memory chips.

11. The system of claim 1, wherein when the detection algorithm of one of the detection units is adapted by the evaluation unit, the respective detection unit is adapted to perform the adapted detection algorithm on the stored encoded input data for retrieving detected bits and to output the detected bits and detection information associated with the adapted detection algorithm.

12. The system of claim 1, wherein when the detection algorithm of one of the detection units is adapted by the evaluation unit, the evaluation unit is adapted to perform the detection algorithm for the respective memory chip.

13. The system of claim 12, wherein the evaluation unit is adapted to re-produce the detected bits and the detection information of each of the memory chips by performing the detection algorithm on data received from each of the memory chips.

14. A method for reducing uncorrectable errors in non-volatile memory chips, the method comprising:
    storing encoded input data in a plurality of memory chips;

retrieving a set of detected bits from the plurality of memory chips;

performing a detection algorithm on the retrieved set of detected bits, wherein the retrieved set of detected bits and detection information associated with the detection algorithm is output, wherein the detection information includes a set of thresholds and soft information;

in response to an evaluation of the detection information for a memory chip in the plurality of memory chips being above a pre-determined threshold, adapting the detection algorithm for the memory chip;

receiving the retrieved set of detected bits;

combining the retrieved set of detected bits; and outputting decoded data by decoding the combined retrieved set of detected bits.

15. The method of claim 14, wherein the step of evaluating the detection information comprises determining whether any threshold deviates from other thresholds of the same set.

16. The method of claim 15, further comprising:

replacing the median value of the set in response to a deviating threshold.

17. A non-transitory computer program product for reducing uncorrectable errors in non-volatile memory chips including a computer readable storage medium having program instructions embodied therewith, the program instructions executable by a computer device to cause the computer device to performing operations comprising the steps of:

storing encoded input data in a plurality of memory chips;

retrieving a set of detected bits from the plurality of memory chips;

performing a detection algorithm on the retrieved set of detected bits, wherein the retrieved set of detected bits and detection information associated with the detection algorithm is output, and wherein the detection information includes a set of thresholds and soft information;

in response to an evaluation of the detection information for a memory chip in the plurality of memory chips being above a pre-determined threshold, adapting the detection algorithm for the memory chip;

receiving the retrieved set of detected bits;

combining the retrieved set of detected bits; and outputting decoded data by decoding the combined retrieved set of detected bits.

18. The non-transitory computer program product of claim 17, wherein the step of evaluating the detection information comprises determining whether any threshold deviates from other thresholds of the same set.

19. The non-transitory computer program product of claim 18, further comprising:

replacing the median value of the set in response to a deviating threshold.

* * * * *